(12) United States Patent
Lee et al.

(10) Patent No.: US 9,997,821 B2
(45) Date of Patent: Jun. 12, 2018

(54) FREQUENCY MODULATION ASSEMBLY AND CAVITY FILTER

(71) Applicants: Dongguan ACE Technologies Corp., Dongguan (CN); Ace Technologies Corp., Incheon (KR)

(72) Inventors: Seungheon Lee, Dongguan (CN); Byungsung Kim, Dongguan (CN); Jonghwa Kim, Dongguan (CN)

(73) Assignees: DONGGUAN ACE TECHNOLOGIES CORP., Dongguan (CN); ACE TECHNOLOGIES CORP., Incheon (KR)

( * ) Notice: Subject to any disclaimer, the term of this patent is extended or adjusted under 35 U.S.C. 154(b) by 183 days.

(21) Appl. No.: 15/075,366

(22) Filed: Mar. 21, 2016

(65) Prior Publication Data
US 2016/0204742 A1 Jul. 14, 2016

(30) Foreign Application Priority Data
Dec. 31, 2015 (CN) .................. 2015 2 1144087 U

(51) Int. Cl.
| H01P 7/10 | (2006.01) |
| H01P 1/207 | (2006.01) |
| H03C 7/02 | (2006.01) |
| H01P 1/208 | (2006.01) |
| H01P 7/04 | (2006.01) |

(52) U.S. Cl.
CPC .............. *H01P 7/10* (2013.01); *H01P 1/207* (2013.01); *H01P 1/2084* (2013.01); *H03C 7/02* (2013.01)

(58) Field of Classification Search
CPC ........ H01P 1/2053; H01P 7/06; H01P 1/2084; H01P 7/10; H01P 7/04; H01P 1/202; H03J 1/00
See application file for complete search history.

(56) References Cited

U.S. PATENT DOCUMENTS

| 3,733,567 A * | 5/1973 | Johnson ................ H01P 7/04 333/226 |
| 4,035,749 A * | 7/1977 | Slocum .................. H01P 1/28 333/232 |

(Continued)

*Primary Examiner* — Dean Takaoka
*Assistant Examiner* — Alan Wong
(74) *Attorney, Agent, or Firm* — Shimokaji IP

(57) ABSTRACT

A frequency modulation assembly includes a self-locking screw, a self-locking adjuster and an elastic member. The self-locking screw has a first external screw thread, the self-locking adjuster has a mounting hole in which an internal screw thread is formed, the self-locking screw is inserted into the mounting hole, and the first external screw thread is engaged with the internal screw thread to achieve a connection between the self-locking screw and the self-locking adjuster, one end of the self-locking screw which passes through the mounting hole is inserted into a ceramic resonance rod in the cavity filter, and the elastic member is connected with the self-locking screw and configured between the self-locking adjuster and the ceramic resonance rod. The frequency modulation assembly can decrease accumulated assembly tolerances, reduce manufacturing cost and improve assembly efficiency, further the elastic member is beneficial to adjust the accuracy of the frequency modulation effect.

12 Claims, 4 Drawing Sheets

Fig.3

(56) References Cited

U.S. PATENT DOCUMENTS

| | | | | |
|---|---|---|---|---|
| 6,362,708 B1* | 3/2002 | Woods | ............... | H01P 1/20309 |
| | | | | 333/219.1 |
| 6,496,089 B1* | 12/2002 | Åkesson | ................... | H01P 7/10 |
| | | | | 333/219.1 |
| 6,535,086 B1* | 3/2003 | Liang | ..................... | H01P 1/205 |
| | | | | 333/219.1 |
| 6,734,766 B2* | 5/2004 | Lye | ..................... | H01P 1/2053 |
| | | | | 333/203 |
| 7,005,951 B2* | 2/2006 | Motooka | .................. | H01P 1/00 |
| | | | | 333/202 |
| 7,078,990 B1* | 7/2006 | Patel | ........................ | H01P 7/06 |
| | | | | 333/202 |
| 7,227,434 B2* | 6/2007 | Haraldsson | ........... | F16B 39/284 |
| | | | | 331/96 |
| 7,728,700 B2* | 6/2010 | Sieber | .................. | H01P 1/2053 |
| | | | | 333/206 |
| 8,362,855 B2* | 1/2013 | Lee | ..................... | H01P 1/2084 |
| | | | | 333/203 |
| 8,773,222 B2* | 7/2014 | Myllyvainio | ............. | H01P 7/10 |
| | | | | 333/202 |
| 9,397,377 B2* | 7/2016 | Seo | ....................... | H01P 1/2084 |
| 2017/0207509 A1* | 7/2017 | Yoon | ...................... | H01P 1/207 |
| 2017/0301976 A1* | 10/2017 | Letaief | ................. | H01P 1/2053 |

* cited by examiner

FREQUENCY MODULATION ASSEMBLY AND CAVITY FILTER

RELATED APPLICATIONS

This application claims the benefit of priority to Chinese Patent Application No. 201521144087.6, filed Dec. 31, 2015, which is hereby incorporated by reference in its entirety.

FIELD OF THE INVENTION

The present invention relates to technical field of radio frequency (RF) communications and, more particularly to a frequency modulation assembly and a cavity filter.

BACKGROUND OF THE INVENTION

Cavity filters served as frequency choosing devices are widely used in communication field, specifically radio frequency communications field. Filters in a base station are used for choosing communication signals and filtering clutters or interference signals beyond the communication signal frequency. Generally, the cavity filter includes a cavity, a resonance rod, a cover plate and a frequency modulation assembly, and the cover plate is located at the top of the cavity, the resonance rod is located in the cavity, and the frequency modulation assembly is extended into the resonance rod from the cover plate.

As shown in FIG. 1, a conventional frequency modulation assembly includes a self-locking screw 10, a locknut 11, an adjusting cover 12 and a gasket 13. The locknut 11 and the adjusting cover 12 are arranged for locking the self-locking screw 10 to a desired position and inserting the self-locking screw 10 into the resonance rod 14. However, the conventional frequency modulation assembly has the following drawbacks. First, the components are complex which may cause accumulated assembly tolerances during the assembly to reduce the frequency modulation effect. Second, the use of the locknut 11 will increase the cost and reduce the assembly efficiency accordingly.

Therefore, there is a need for providing an improved frequency modulation assembly and a cavity filter to overcome the above-mentioned drawbacks.

SUMMARY OF THE INVENTION

Objectives of the present invention is to provide a frequency modulation assembly and a cavity filter with the same, to decrease accumulated assembly tolerances, reduce manufacturing cost and improve assembly efficiency.

To achieve the above-mentioned objectives, a frequency modulation assembly of the present invention, adapted for a cavity filter, includes a self-locking screw, a self-locking adjuster and an elastic member. The self-locking screw has a first external screw thread, the self-locking adjuster has a mounting hole in which an internal screw thread is formed, the self-locking screw is inserted into the mounting hole, and the first external screw thread is engaged with the internal screw thread to achieve a connection between the self-locking screw and the self-locking adjuster, one end of the self-locking screw which passes through the mounting hole is inserted into a ceramic resonance rod in the cavity filter, and the elastic member is connected with the self-locking screw and configured between the self-locking adjuster and the ceramic resonance rod.

In comparison with the prior art, the frequency modulation assembly of the present invention includes the self-locking screw having the first external screw thread, the self-locking adjuster having the mounting hole in which the internal screw thread is formed, and the elastic member. During the assembly, the self-locking screw is firstly inserted into the mounting hole so that the first external screw thread and the internal screw thread are engaged with each other to achieve the connection between the self-locking screw and self-locking adjuster, then the end of the self-locking screw passing through the mounting hole is connected with the elastic member and then inserted into the ceramic resonance rod of the cavity filter, in such a way, the elastic member is fixed between the self-locking adjuster and the top of the ceramic resonance rod to finish the assembly of the frequency modulation assembly and the ceramic resonance rod. By this token, the frequency modulation assembly according to the present invention needs no locknut, thus manufacturing cost is saved, assembly time is shortened, and assembly efficiency is improved; meanwhile, the accumulated assembly tolerances are decreased to improve the frequency modulation effect. Moreover, the pitch of the self-locking screw is in a range of 0.3 mm to 0.5 mm due to the elastic member, which is beneficial to adjust the accuracy of the frequency modulation effect. It should be noted that, the frequency modulation assembly of the present invention is applicable to TDMR.

Preferably, a second external screw thread is provided on a perimeter of the self-locking adjuster, whereby the self-locking adjuster is mounted on the cover plate of the cavity filter.

Preferably, the self-locking adjuster comprises a mounting portion and a protruding portion protruding from the mounting portion, centers of the protruding portion, the mounting portion and the mounting hole are overlapped, and the second external screw thread is formed on a perimeter of the mounting portion.

Preferably, the protruding portion is a round lug boss that is hollow.

Preferably, two locating holes are provided on the mounting portion, and the locating holes are symmetrical with the center of the mounting portion.

Preferably, the mounting portion and the elastic member are round in shape, and the diameter of the mounting portion is the same with that of the elastic member.

Preferably, the elastic member is a rubber ring.

Accordingly, a cavity filter of the present invention includes a cavity, a ceramic resonance rod, a cover plate and a frequency modulation assembly. The ceramic resonance rod is configured in the cavity, the cover plate is covered on the cavity, the frequency modulation assembly is mounted on the cover plate and inserted into the ceramic resonance rod, and the frequency modulation assembly has the structure mentioned above.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
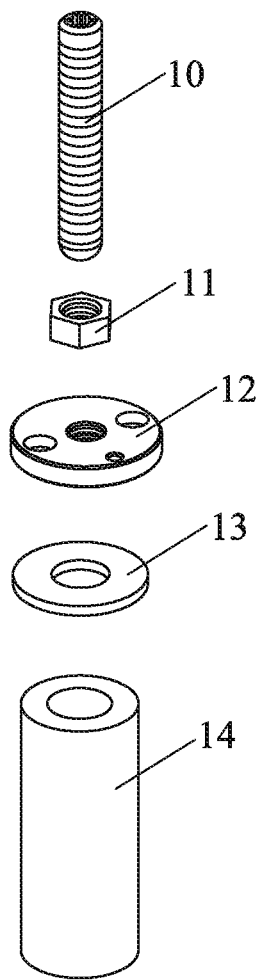
FIG. 1 is an exploded view of a conventional frequency modulation assembly.

Various preferred embodiments of the invention will now be described with reference to the figures, wherein like reference numerals designate similar parts throughout the various views.

Figure 2:
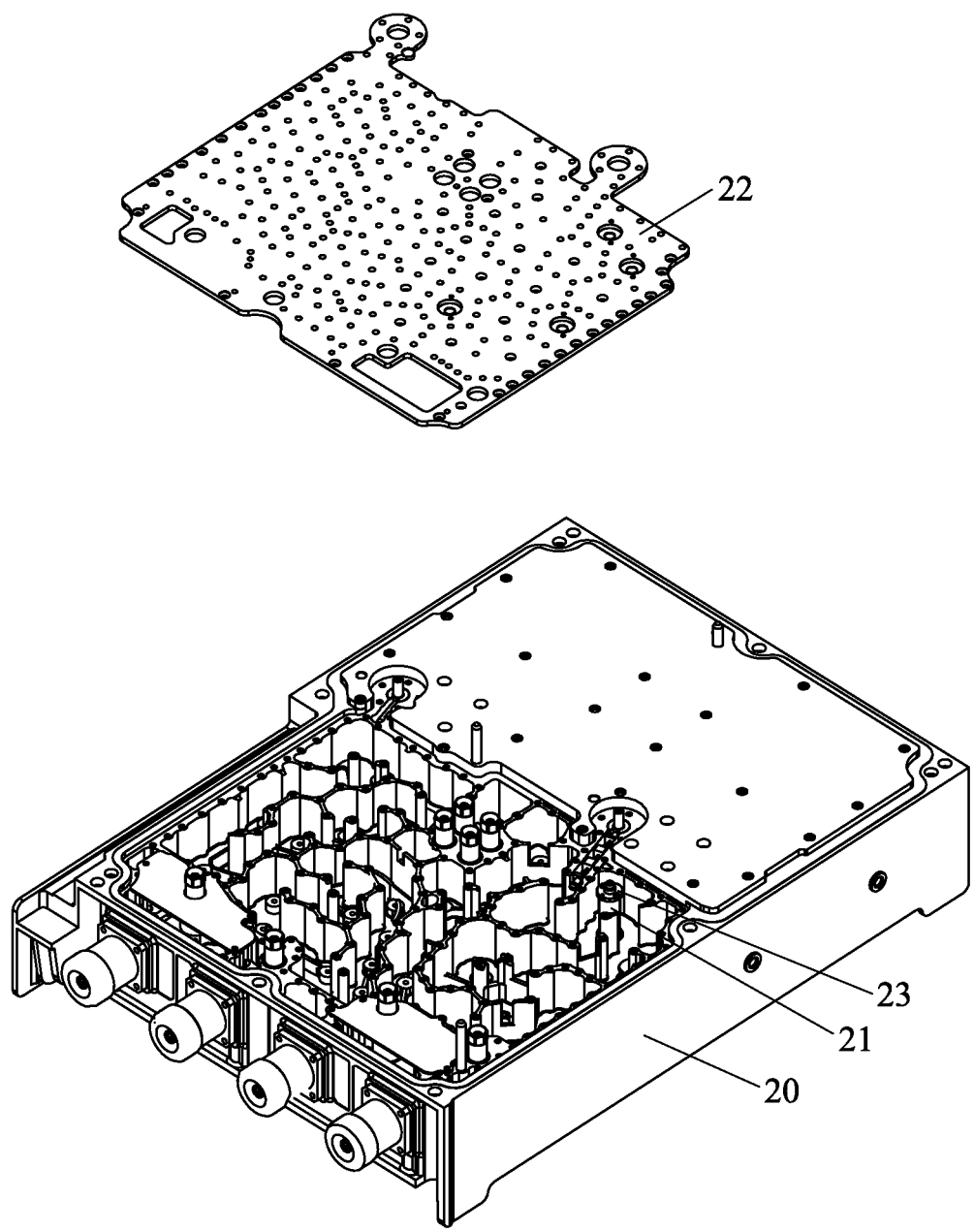
FIG. 2 is a structural view of a cavity filter according to present invention.

Referring to FIG. 2, a cavity filter of the present invention includes a cavity 20, a ceramic resonance rod 21, a cover plate 22 and a frequency modulation assembly 23. Specifically, the ceramic resonance rod 21 is configured in the cavity 20, the cover plate 22 is covered on the cavity 20, and the frequency modulation assembly 23 is mounted on the cover plate 20 and inserted into the ceramic resonance rod 21.

Figure 3:
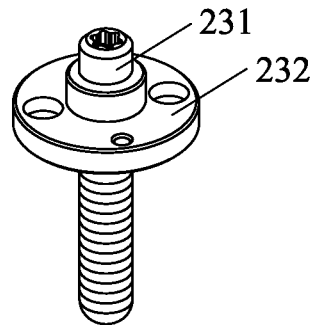
FIG. 3 is structural view of a frequency modulation assembly shown in FIG. 2.
Figure 4:
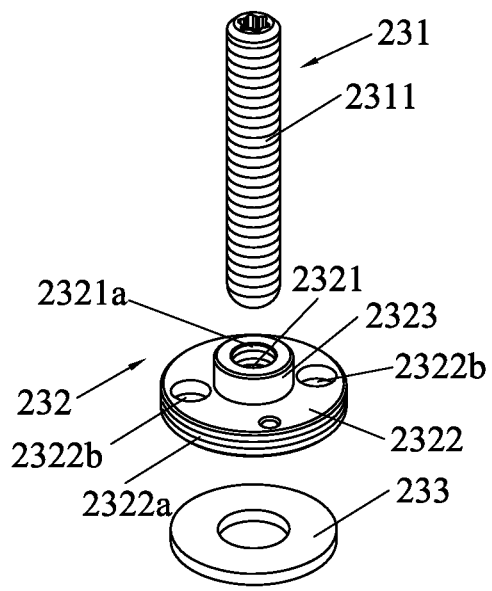
FIG. 4 is an exploded view of FIG. 3.
Figure 5:
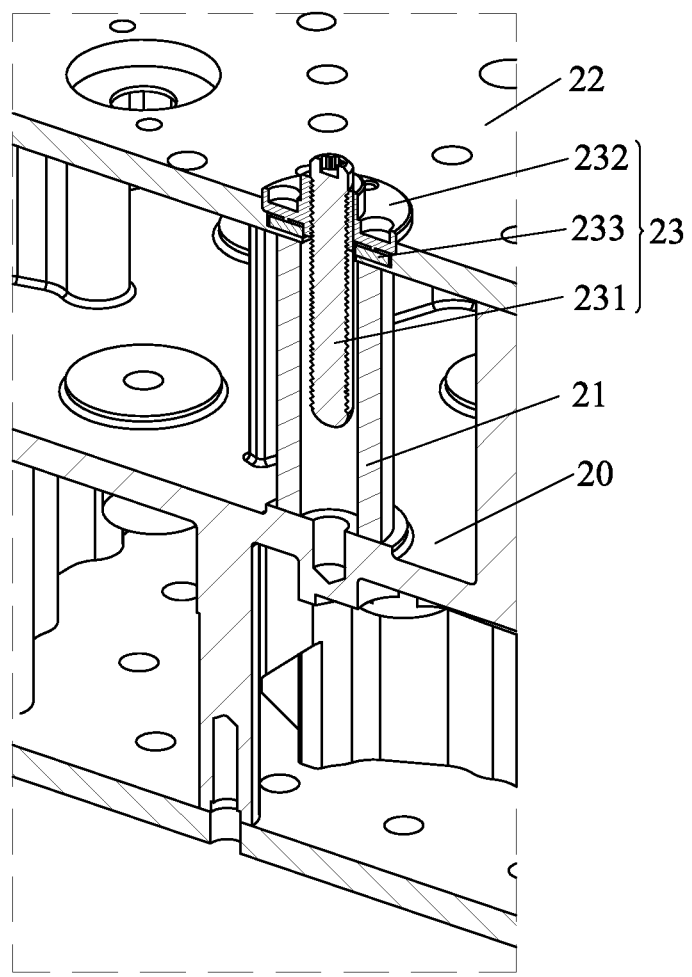
FIG. 5 is a sectional view of the frequency modulation assembly mounting to a ceramic resonance rod.

Referring to FIGS. 3 to 4, the frequency modulation assembly 23 includes a self-locking screw 231, a self-locking adjuster 232 and an elastic member 233. The self-locking screw 231 includes a first external screw thread 2311, the self-locking adjuster 232 includes a mounting hole 2321 in which an internal screw thread 2321a is formed. The self-locking screw 231 is inserted into the mounting hole 2321, and the first external screw thread 2311 is engaged with the internal screw thread 2321a to achieve the connection between the self-locking screw 231 and the self-locking adjuster 232, one end of the self-locking screw 231 which passes through the mounting hole 2321 is inserted into the ceramic resonance rod 21 (as shown in FIG. 5), and the elastic member 233 is connected with the self-locking screw 231 and configured between the self-locking adjuster 232 and the ceramic resonance rod 21.

Specifically, the self-locking adjuster 232 includes a mounting portion 2322 and a protruding portion 2323 protruding from the mounting portion 2322, centers of the protruding portion 2323, the mounting portion 2322 and the mounting hole 2321 are overlapped. A second external screw thread 2322a is formed on the perimeter of the mounting portion 2322, whereby the self-locking adjuster 232, the self-locking screw 231 and the elastic member 233 assembled with the self-locking adjuster 232 can be mounted on the cover plate 22 of the cavity filter.

Further, two mounting holes 2322b are formed on the mounting portion 2322, which are symmetrical with the center of the mounting portion 2322. Thus the self-locking adjuster 232 with the self-locking screw 231 and the elastic member 233 assembled can be easily installed to the cover plate 22, thereby saving the assemble time.

Specifically, in the present embodiment, the protruding portion 2323 is a round lug boss that is hollow. The elastic member 233 is a rubber ring. Further, both of the mounting portion 2322 and the elastic member 233 are round in shape, and the diameter of the mounting portion 2322 is the same with that of the elastic member 233.

When assembling the frequency modulation assembly and the cavity filter, the self-locking screw 231 is firstly inserted into the mounting hole 2321 so that the first external screw thread 2311 and the internal screw thread 2321a are engaged with each other to achieve the connection between the self-locking screw 231 and self-locking adjuster 232, then the end of the self-locking screw 231 passing through the mounting hole 2321 is connected with the elastic member 233 and then inserted into the ceramic resonance rod 21 of the cavity filter, in such a way, the elastic member 233 is fixed between the self-locking adjuster 232 and the top of the ceramic resonance rod 21 to finish the assembly of the frequency modulation assembly 23 and the ceramic resonance rod 21. By this token, the frequency modulation assembly 23 according to the present invention needs no locknut, thus manufacturing cost is saved, assembly time is shortened, and assembly efficiency is improved; meanwhile, the accumulated assembly tolerances are decreased to improve the frequency modulation effect. Moreover, the pitch of the self-locking screw is in a range of 0.3 mm to 0.5 mm due to the elastic member, which is beneficial to adjust the accuracy of the frequency modulation effect. It should be noted that, the frequency modulation assembly of the present invention is applicable to TDMR.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A frequency modulation assembly, adapted for a cavity filter, comprising a self-locking screw, a self-locking adjuster and an elastic member, wherein the self-locking screw has a first external screw thread, the self-locking adjuster has a mounting hole in which an internal screw thread is formed, the self-locking screw is inserted into the mounting hole, and the first external screw thread is engaged with the internal screw thread to achieve a connection between the self-locking screw and the self-locking adjuster, one end of the self-locking screw which passes through the mounting hole is inserted into a ceramic resonance rod in the cavity filter, and the elastic member is connected with the self-locking screw and configured between the self-locking adjuster and the ceramic resonance rod, wherein a second external screw thread is provided on a perimeter of the self-locking adjuster, whereby the self-locking adjuster is mounted on the cover plate of the cavity filter.

2. The frequency modulation assembly according to claim 1, wherein the self-locking adjuster comprises a mounting portion and a protruding portion protruding from the mounting portion, centers of the protruding portion, the mounting portion and the mounting hole are overlapped, and the second external screw thread is formed on a perimeter of the mounting portion.

3. The frequency modulation assembly according to claim 2, wherein the protruding portion is a round lug boss that is hollow.

4. The frequency modulation assembly according to claim 2, wherein two locating holes are provided on the mounting portion, and the locating holes are symmetrical with the center of the mounting portion.

5. The frequency modulation assembly according to claim 4, wherein the mounting portion and the elastic member are round in shape, and the diameter of the mounting portion is the same with that of the elastic member.

6. The frequency modulation assembly according to claim 5, wherein the elastic member is a rubber ring.

7. A cavity filter, comprising a cavity, a ceramic resonance rod, a cover plate and a frequency modulation assembly, wherein the ceramic resonance rod is configured in the cavity, the cover plate is covered on the cavity, the frequency modulation assembly is mounted on the cover plate and inserted into the ceramic resonance rod, and the frequency modulation assembly comprises a self-locking screw, a self-locking adjuster and an elastic member, wherein the self-locking screw has a first external screw thread, the self-locking adjuster has a mounting hole in which an internal screw thread is formed, the self-locking screw is inserted into the mounting hole, and the first external screw thread is engaged with the internal screw thread to achieve a connection between the self-locking screw and the self-locking adjuster, one end of the self-locking screw which passes through the mounting hole is inserted into the ceramic resonance rod, and the elastic member is connected with the self-locking screw and configured between the self-locking adjuster and the ceramic resonance rod, wherein a second external screw thread is provided on a perimeter of the self-locking adjuster, whereby the self-locking adjuster is mounted on the cover plate of the cavity filter.

8. The cavity filter according to claim 7, wherein the self-locking adjuster comprises a mounting portion and a protruding portion protruding from the mounting portion, centers of the protruding portion, the mounting portion and the mounting hole are overlapped, and the second external screw thread is formed on a perimeter of the mounting portion.

9. The cavity filter according to claim 8, wherein the protruding portion is a round lug boss that is hollow.

10. The cavity filter according to claim 8, wherein two locating holes are provided on the mounting portion, and the locating holes are symmetrical with the center of the mounting portion.

11. The cavity filter according to claim 10, wherein the mounting portion and the elastic member are round in shape, and the diameter of the mounting portion is the same with that of the elastic member.

12. The cavity filter according to claim 11, wherein the elastic member is a rubber ring.

\* \* \* \* \*